United States Patent
Gupta et al.

(10) Patent No.: US 10,771,280 B1
(45) Date of Patent: Sep. 8, 2020

(54) LOW-POWER WAKE-UP CIRCUIT FOR CONTROLLER AREA NETWORK (CAN) TRANSCEIVER

(71) Applicant: TEXAS INSTRUMENTS INCORPORATED, Dallas, TX (US)

(72) Inventors: Lokesh Kumar Gupta, Bengaluru (IN); Basant Bothra, Bengaluru (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 16/538,975

(22) Filed: Aug. 13, 2019

(30) Foreign Application Priority Data

Feb. 20, 2019 (IN) .............................. 201941006690

(51) Int. Cl.
| | |
|---|---|
| H04L 12/40 | (2006.01) |
| H03K 5/003 | (2006.01) |
| H04B 1/40 | (2015.01) |
| H03K 5/24 | (2006.01) |
| G05F 3/10 | (2006.01) |
| H03K 5/01 | (2006.01) |

(52) U.S. Cl.
CPC .......... *H04L 12/40013* (2013.01); *G05F 3/10* (2013.01); *H03K 5/003* (2013.01); *H03K 5/01* (2013.01); *H03K 5/24* (2013.01); *H04B 1/40* (2013.01)

(58) Field of Classification Search
CPC ........... H03F 2200/72; H04L 12/40013; H04L 12/40032; H03K 5/24
See application file for complete search history.

(56) References Cited

U.S. PATENT DOCUMENTS

| | | | | |
|---|---|---|---|---|
| 6,094,105 | A * | 7/2000 | Williamson | ............. H03B 5/36 331/116 FE |
| 6,882,224 | B1 * | 4/2005 | Gaboury | ................. H03F 1/301 330/253 |
| 10,177,713 | B1 * | 1/2019 | Far | ........................ H03F 1/0244 |
| 2003/0184388 | A1 * | 10/2003 | Wilson | .................... H03F 3/082 330/308 |
| 2003/0227328 | A1 * | 12/2003 | Ivanov | .................. H03F 3/3028 330/264 |
| 2006/0160511 | A1 * | 7/2006 | Trichy | ............. H04L 12/40013 455/255 |
| 2006/0170451 | A1 * | 8/2006 | Jordanger | ........ H03K 19/00346 326/34 |
| 2006/0207498 | A1 * | 9/2006 | Cappon | ............... H02M 7/5387 117/202 |
| 2007/0217548 | A1 * | 9/2007 | Berckmans | ......... H04L 12/4135 375/317 |
| 2009/0302822 | A1 * | 12/2009 | Chao | ........................ G05F 3/30 323/313 |
| 2010/0148849 | A1 * | 6/2010 | Lee | ...................... H03D 7/1458 327/416 |

(Continued)

*Primary Examiner* — Adam D Houston
(74) *Attorney, Agent, or Firm* — John R. Pessetto; Charles A. Brill; Frank D. Cimino

(57) ABSTRACT

A system includes a controller area network (CAN) transceiver. The CAN transceiver includes a wake-up circuit having an attenuator circuit coupled to a CAN bus. The wake-up circuit also includes a common-gate amplifier circuit coupled to the attenuator circuit. The wake-up circuit also includes an offset generation circuit coupled to the common-gate amplifier circuit.

22 Claims, 4 Drawing Sheets

(56) References Cited

U.S. PATENT DOCUMENTS

| | | | |
|---|---|---|---|
| 2014/0266845 A1* | 9/2014 | Lee | H03F 3/70 |
| | | | 341/155 |
| 2015/0102856 A1* | 4/2015 | Barrett, Jr. | G05F 3/30 |
| | | | 327/539 |
| 2015/0200825 A1* | 7/2015 | Jang | H04L 67/12 |
| | | | 370/216 |
| 2017/0077884 A1* | 3/2017 | Park | H03F 1/086 |
| 2018/0136355 A1* | 5/2018 | Zhang | H03K 17/08122 |
| 2019/0393846 A1* | 12/2019 | Glaser | H03F 3/345 |
| 2020/0112167 A1* | 4/2020 | Jang | G06F 13/4282 |

* cited by examiner

US 10,771,280 B1

LOW-POWER WAKE-UP CIRCUIT FOR CONTROLLER AREA NETWORK (CAN) TRANSCEIVER

CROSS-REFERENCE TO RELATED APPLICATIONS

This application claims priority to Indian Provisional Application No. 201941006690, filed Feb. 20, 2019, which is hereby incorporated by reference.

BACKGROUND

The Controller Area Network (CAN) standard was developed for the automotive industry to standardize wiring and communications between sensors and a microcontroller (e.g., for engine control, window motors, airbags, anti-lock brakes, etc.). The CAN standard is now used in various settings, including factory equipment, medical equipment, marine equipment, downhole equipment, aerospace equipment, and automotive vehicles.

In an example CAN scenario, a CAN transceiver is coupled between a microprocessor (MCU) and a communication bus. The communication bus may be coupled to different kinds of sensors depending on the specific scenario (e.g., factory equipment, medical equipment, marine equipment, downhole equipment, aerospace equipment, or automotive vehicle), In operation, the CAN transceiver conveys communications received from the communication bus to the microprocessor and/or conveys communications from the microprocessor to the communication bus.

The CAN standard specifies an input voltage supply for the CAN transceiver of 5V. Meanwhile, the MCU may receive a different voltage supply. For example, one existing CAN system includes an MCU that receives an input voltage supply of 3.3V. Efforts to reduce power consumption in a CAN system are ongoing, which is desirable in limited power scenarios involving a battery or limited power source.

SUMMARY

In accordance with at least one example of the disclosure, a system comprises a controller area network (CAN) transceiver. The CAN transceiver comprises a wake-up circuit having an attenuator circuit coupled to a CAN bus. The wake-up circuit also comprises a common-gate amplifier circuit coupled to the attenuator circuit. The wake-up circuit also comprises an offset generation circuit coupled to the common-gate amplifier circuit.

In accordance with at least one example of the disclosure, a transceiver comprises a wake-up circuit having an attenuator circuit coupled to a CAN bus. The wake-up circuit also comprises an amplifier circuit coupled to the attenuator circuit. The wake-up circuit also comprises an offset generation circuit with a bias current circuit coupled to the amplifier circuit.

In accordance with at least one example of the disclosure, an integrated circuit, comprises a CAN transceiver having a wake-up circuit. The wake-up circuit comprises an attenuator circuit coupled to a CAN bus. The wake-up circuit also comprises an amplifier circuit coupled to the attenuator circuit. The wake-up circuit also comprises an offset generation circuit with a bias current circuit coupled to the amplifier circuit. The wake-up circuit also comprises an under-voltage lockout (UVLO) circuit coupled to the bias current circuit.

BRIEF DESCRIPTION OF THE DRAWINGS

For a detailed description of various examples, reference will now be made to the accompanying drawings in which.

DETAILED DESCRIPTION

Figure 1:
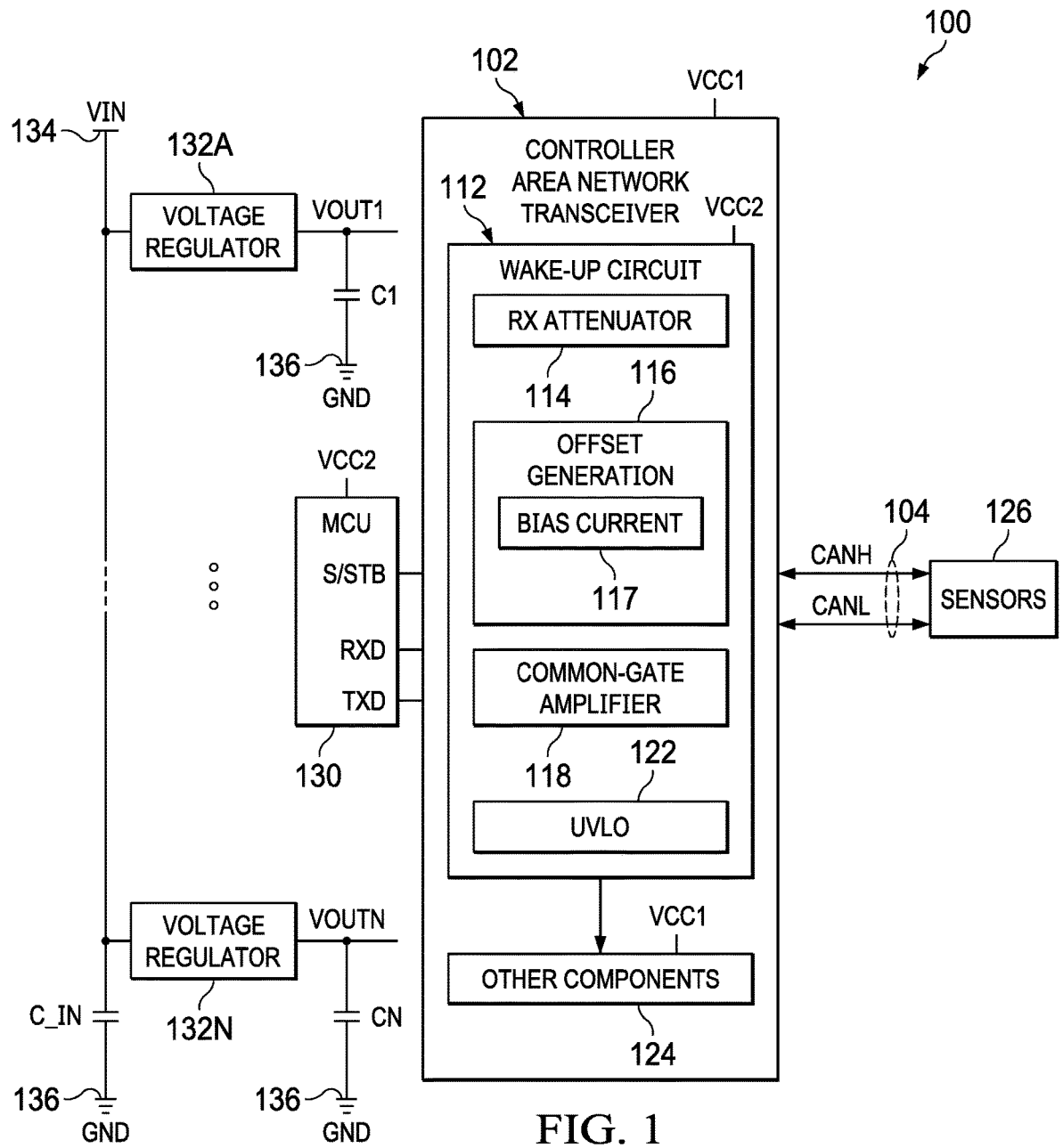
FIG. 1 is a block diagram showing a system in accordance with some examples.

Disclosed herein are controller area network (CAN) transceiver topologies that reduce power consumption compared to previous CAN transceiver. In some examples, the wake-up circuit for a CAN transceiver is configured to operate using a reduced input voltage supply (e.g., 2V or less). In various examples, the wake-up circuit is also configured to support features such as: an input common-mode voltage (VCM) is +1-12V; functionality in presence of direct power injection (DPI); and a powered off leakage current of less than SpA. With the wake-up circuit configured to operate using a reduced input voltage, only the voltage regulator that provides the reduced input voltage supply needs to be on while the CAN system is in a standby state. Any other voltage regulators of a CAN system can be turned off to reduce power consumption until the wake-up circuit detects a wake-up event (e.g., receiving a communication from a CAN bus coupled to the CAN transceiver).

In an example system, a CAN transceiver includes a wake-up circuit having an attenuator circuit coupled to a CAN bus. The wake-up circuit also comprises a common-gate amplifier circuit coupled to the attenuator circuit. The wake-up circuit also comprises an offset generation circuit coupled to the common-gate amplifier circuit. In some examples, the wake-up circuit includes: an attenuator circuit coupled to a CAN bus; an amplifier circuit coupled to the attenuator circuit; and an offset generation circuit coupled to the amplifier circuit, where the offset generation circuit includes a bias current circuit (e.g., a bandgap voltage reference circuit) coupled to the amplifier circuit. In some examples, the wake-up circuit includes: an attenuator circuit coupled to a CAN bus; an amplifier circuit coupled to the attenuator circuit; an offset generation circuit coupled to the amplifier circuit, where the offset generation circuit includes a bias current circuit; and an under-voltage lockout (UVLO) circuit configured to detect if a supply to the wake-up circuit has reached a minimum operating voltage for the wake-up circuit In some examples, the wake-up circuit is configured to operate using a reduced input voltage supply (e.g., 2V or less).

Using a reduced input voltage supply for the wake-up circuit relative to other components of the CAN transceiver means that a 5V voltage regulator used for some operations of the CAN transceiver can be turned off when the CAN transceiver is in a standby mode (e.g., no communications are being received from or transmitted to the CAN bus). In some examples, the reduced input voltage supply is also used by a microcontroller (MCU) coupled to the CAN transceiver. In the standby state, the wake-up circuit of the CAN transceiver stays on while other portions of the CAN transceiver are turned off. In this standby state, communications between the MCU and sensor units coupled to the CAN transceiver via a CAN bus do not occur until the CAN transceiver awakes (e.g., in response to the wake-up circuit detecting a communication or pulse from the CAN bus). Once the CAN transceiver is awake (normal mode), communications between the MCU and the sensor units are possible as desired. Once the communications are complete and/or if a predetermined interval passes without further communications, the CAN transceiver returns to the standby mode. To provide a better understanding, various switching converter options and related offset adjustment options are described using the figures as follows.

FIG. 1 is a block diagram showing a system 100 in accordance with some examples. As shown, the system 100 includes a CAN transceiver 102 coupled to sensors 126 via a CAN bus 104. The CAN transceiver 102 is also coupled to an MCU 130. As shown, the MCU 130 includes a S/STB pin, a receive data (RXD) pin, and a transmit data (TXD) pin. In operation, if the MCU 130 decides to turn off the CAN transceiver 102, the STB signal is asserted and the TXD pin becomes irrelevant. The RXD changes its state only if the wake-up circuit 112 of the CAN transceiver 102 detects a wake-up trigger or pattern and asserts a signal on the RXD pin. If the MCU 130 decides to put the CAN transceiver 102 in normal mode, the STB is de-asserted. Thereafter, data put on TXD pin by the MCU 130 is reflected on CAN bus 104 and on the RXD pin. Thus, when fully awake (e.g., normal mode), the CAN transceiver 102 enables communications between the MCU 130 and the sensors 126. When in a standby mode, some components 124 of the CAN transceiver 102 are turned off while other components (e.g., the wake-up circuit 112) are on. In some examples, the attenuator circuit 114, the bias current circuit 120, and the UVLO circuit 122 of the CAN transceiver 102 are used in the normal mode, while the offset generation circuit 116 and the common-gate amplifier circuit 118 may be on or off in the normal mode.

To power the CAN transceiver 102, the MCU 130, and possibly other components, the system 100 includes a plurality of voltage regulators 132A-132N, such as low dropout regulators (LDOs) or switching regulators. As shown, the voltage regulators 132A-132N are coupled to an input voltage supply (VIN) node 134 and to a first (e.g., top) plate of a capacitor (C_IN). The second (e.g., bottom) plate of C_IN is coupled to a ground node 136. The outputs of the voltage regulators 132A-132N are respective output voltage signals (VOUT1-VOUTN) that are used by the various components of the system 100. For example, a first input voltage supply (VCC1) for the CAN transceiver 102 corresponds to one of VOUT1-VOUTN, while a second input voltage supply (VCC2) for the MCU 130 and the wake-up circuit 112 of the CAN transceiver 102 corresponds to another one of VOUT1-VOUTN. In one example, VCC1 is 5V and VCC2 is 1.8V.

In the example of FIG. 1, the wake-up circuit 112 includes an attenuator circuit 114, an offset generation circuit 116 with a bias current circuit 117, a common-gate amplifier circuit 118, a bandgap voltage reference circuit 120, and a UVLO circuit 122. In some examples, each circuit of the wake-up circuit 112 is powered by VCC2. Meanwhile, other components 124 of the CAN transceiver 102 are powered by VCC1 or other voltage levels. Over time, the CAN transceiver 102 switches between a standby mode and a normal mode. When the CAN transceiver 102 is in the standby mode, a related voltage regulator (one of the voltage regulators 132A-132N) is powered off to reduce power consumption. Subsequently, in response to receiving a valid wake-up pattern (e.g., according to the ISO 11898-2 standard) from the CAN bus 104, the CAN transceiver 102 transitions to the normal mode to handle communications between the MCU 130 and the sensors 126. Once the communications are complete or the CAN transceiver 102 otherwise does not need to be in the normal mode, the CAN transceiver 102 transitions to the standby mode. For example, this is done by the MCU 130 making the STB pin high (the CAN transceiver 102 does not transition to the standby mode by itself).

Figure 2:
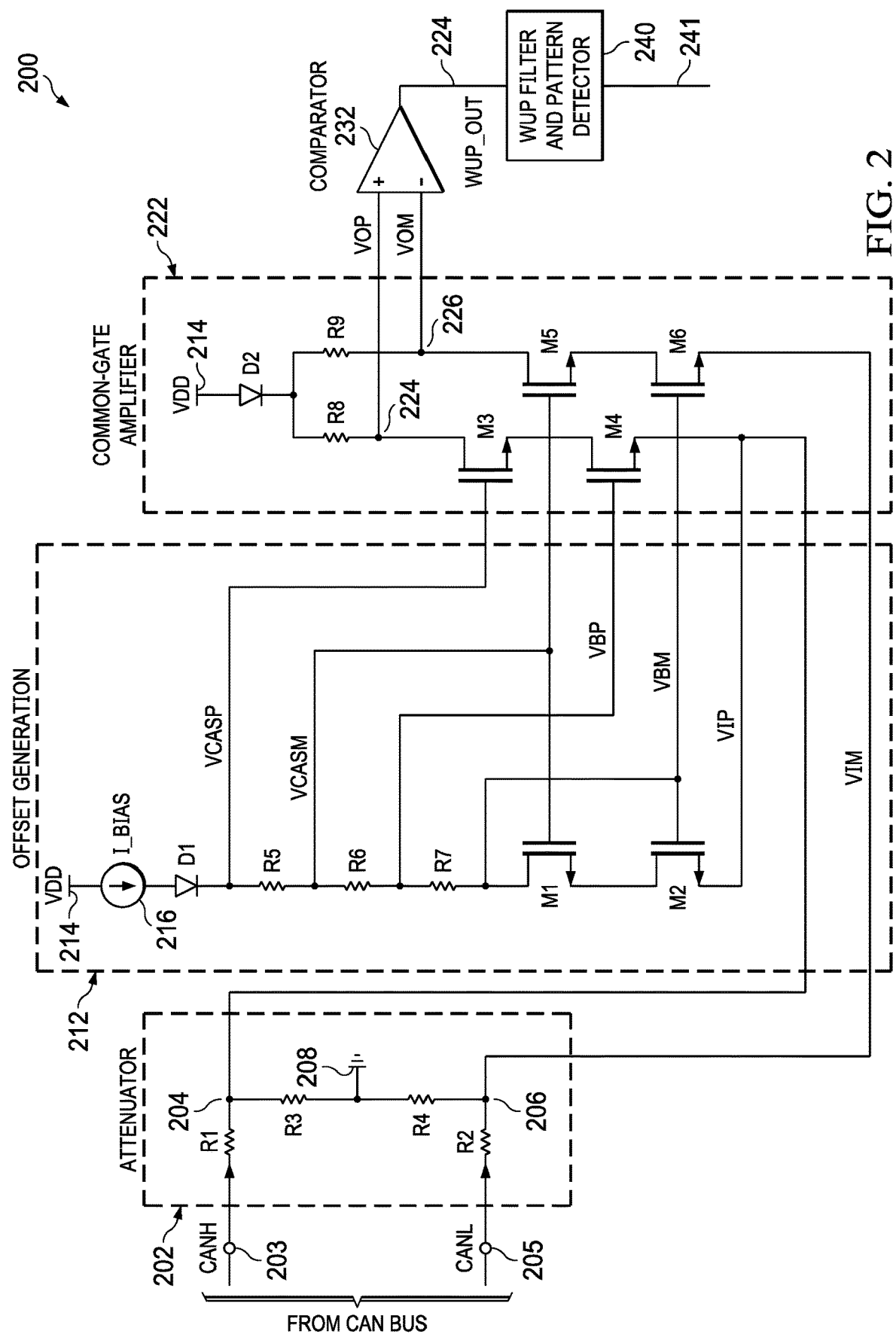
FIG. 2 is a schematic diagram showing part of a wake-up circuit related to a controller area network (CAN) transceiver in accordance with some examples.

FIG. 2 is a schematic diagram showing part of a wake-up circuit 200 (e.g., part of the wake-up circuit 102 of FIG. 1) related to a CAN transceiver (e.g., the CAN transceiver 102 of FIG. 1) in accordance with some examples. In operation, the wake-up circuit 200 is configured to detect when a valid wake-up pattern is received from the CAN bus (e.g., the CAN bus 104) and to provide a wake-up signal in response to detecting a valid wake-up pattern. In some examples, the wake-up pattern rides over a common mode voltage variation of +/−12V. In one example, the wake-up pattern includes a few logic pulses having a minimum bit width. The wake-up circuit 112 detects the logic levels of the pulses to confirm characteristics such as a minimum differential voltage requirement, a bit width of the pulses to confirm a minimum bit width requirement, and the pattern according to the ISO specification requirements.

In the example of the FIG. 2, the wake-up circuit 200 includes an attenuator circuit 202, an offset generation circuit 212, a common-gate amplifier circuit 222, and a comparator 232. In operation, the attenuator circuit 202 attenuates signals received from a CAN bus (e.g., the CAN bus 104 of FIG. 1). Meanwhile, the offset generation circuit 212 provides offset signals for use by the common-gate amplifier circuit 222. As shown, the offset generation circuit 212 also includes a bias current source or circuit 216 configured to provide bias signals for use by the common-gate amplifier circuit 222. The common-gate amplifier circuit 222 uses the offset and bias signals from the offset generation circuit 212 and the bias current source 216 to provide two detection signals that over time indicate the presence or absence of a valid wake-up pattern. More specifically, the comparator 232 compares the two detection signals provided by the common-gate amplifier 222 to generate a wake-up pattern (WUP) signal (WUP_OUT).

In the example of FIG. 2, WUP_OUT of the comparator 232 is fed into a WUP filter and pattern detector 240. When the characteristics of a valid wake-up pattern are detected by the WUP filter and pattern detector 240, a corresponding signal 241 is output from the WUP filter and pattern detector 240. In response to the signal 241 indicating that a valid wake-up pattern has been received, a CAN transceiver (e.g., CAN transceiver 102 in FIG. 1) provides an indication to an MCU (e.g., the MCU 130 in FIG. 1) that the CAN transceiver received a valid wake-up pattern. In response, the MCU decides whether to transition the CAN transceiver to normal mode. On the other hand, when characteristics of a valid wake-up pattern are not detected by the WUP filter and pattern detector 240, the signal 241 indicates that a valid wake-up pattern has not been received. In such case, a CAN transceiver (e.g., the CAN transceiver 102 in FIG. 1) stays in the standby mode.

In the example of FIG. 2, the attenuator circuit 202 includes a first voltage divider formed by R1 and R3. As shown, the first voltage divider includes R1 and R3 in series between a CANH node 203 and a ground node 208. The attenuator circuit 202 also includes a second voltage divider formed by R2 and R4. As shown, the second voltage divider includes R2 and R4 in series between a CANL node 205 and the ground node 208. The node 204 between R1 and R3 is a first output node 204 of the attenuator circuit 202. Meanwhile, the node 206 between R2 and R4 is a second output node 206 of the attenuator circuit 202. With the voltage dividers, the attenuator circuit 202 outputs a scaled version of whatever signals are on the CAN bus.

In the example of FIG. 2, the offset generation circuit 212 comprises a bias current source 216 coupled between an input voltage supply (VDD) node 214 and the anode of a diode (D1). The bias current source 216 provides a bias current for use by the offset generation circuit 212 and the common-gate amplifier circuit 222. The offset generation circuit 212 also includes a voltage divider formed by resistors (R5, R6, and R7), where the voltage divider is between the cathode of D1 and a first current terminal of a first transistor (M1). As shown, the offset generation circuit 212 also includes a second transistor (M2), where the first current terminal of M2 is coupled to a second current terminal of M1. With the voltage divider formed by resistors (R5, R6, and R7) multiple offset and bias voltage values are provided to the common-gate amplifier 222. More specifically, the voltage between the cathode of D1 and R5 is a first offset value (VCASP) provided to the common-gate amplifier 222. Also, the voltage between R5 and R6 is a second offset value (VCASM) provided to the common-gate amplifier 222. Also, the voltage between R6 and R7 is a first bias value (VBP) provided to the common-gate amplifier 222. Also, the voltage between R7 and the first current terminal of M1 is a second bias value (VBM) provided to the common-gate amplifier 222. As shown, the control terminal of M1 is coupled between R5 and R6 to receive VCASM. Also, the control terminal of M2 is coupled between R7 and the first current terminal of M1 to receive VBM. The second current terminal of M2 is coupled to the first output node 204 of the attenuator circuit 202.

In the example of FIG. 2, the common-gate amplifier circuit 212 comprises a third transistor (M3), a fourth transistor (M4), a fifth transistor (M5), and a sixth transistor (M6). As shown, a first current terminal of M3 is coupled to a first output (VOP) node 224 of the common-gate amplifier circuit 222, a second current terminal of M3 is coupled to a first current terminal of M4, and a control terminal of M3 is coupled to the offset generation circuit 212 (between the cathode of D1 and R5) to receive VCASP. Also, a second current terminal of M4 is coupled to the first output node 204 of the attenuator circuit 202, and the control terminal of M4 is coupled to the offset generation circuit 212 (between R6 and R7) to receive VBP. Meanwhile, a first current terminal of M5 is coupled to a second output (VOM) node 226 of the common-gate amplifier circuit 212, a second current terminal of M5 is coupled to a first current terminal of M6, and a control terminal of M5 is coupled to the offset generation circuit 212 (between R5 and R6) to receive VCASM. Also, a second current terminal of M6 is coupled to the second output node 206 of the attenuator circuit 202, and a control terminal of M6 is coupled to the offset generation circuit 212 (between R7 and the first current terminal of M1) to receive VBM.

As shown, the first output node 224 of the common-gate amplifier circuit 222 is coupled to an input voltage supply (VDD) node 214 via a resistor (R8) and a blocking diode (D2). The second output node 226 of the common-gate amplifier circuit 222 is also coupled to the VDD node 214 via another resistor (R8) and D2. As shown, D2 has its cathode facing R8 and R9, while its anode faces the VDD node 214. In some examples, D2 is replaced by a unidirectional current control circuit.

Figure 3:
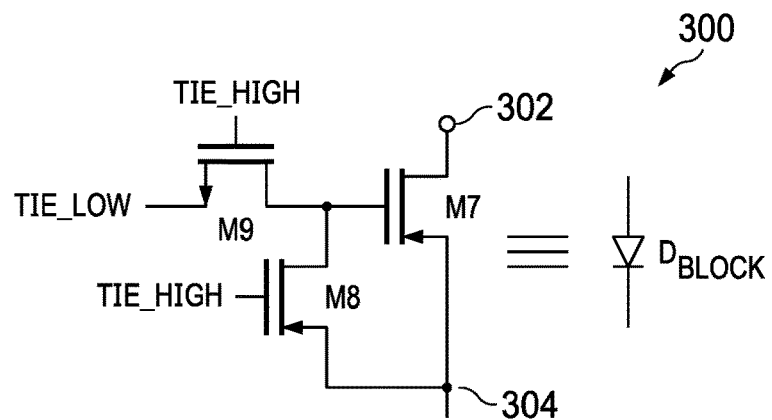
FIG. 3 is a schematic diagram of a unidirectional current control circuit in accordance with some examples.

FIG. 3 is a schematic diagram of a unidirectional current control circuit 300 (e.g., to replace D2 in FIG. 2) in accordance with some examples. As shown, the unidirectional current control circuit 300 comprises three transistors (M7, M8, and M9). More specifically, a first current terminal of M7 is coupled to an input node 302 (e.g., the input node 302 is coupled to the VDD node 214 if the unidirectional current control circuit 300 replaces D2 in FIG. 2) and a second current terminal of M7 is coupled to an output node 304 (e.g., the output node 304 is coupled to R8 and R9 if the unidirectional current control circuit 300 replaces D2 in FIG. 2). The second current terminal of M7 is also coupled to a second current terminal of M8. Also, a control terminal of M7 is coupled to respective first current terminals of M8 and M9. Also, a second current terminal of M9 is coupled to a control node configured to provide a low signal (TIE_LOW). Meanwhile, the control terminals of M8 and M9 are coupled to another control node configured to provide a high signal (TIE_HIGH).

Returning to FIG. 2, if the unidirectional current control circuit 300 is used instead of D2, the voltage drop across unidirectional current control circuit 300 is reduced to using D2. In either case, the output nodes 224 and 226 of the common-gate amplifier circuit 222 are coupled to the inputs of the comparator 232. With the wake-up circuit 200 of FIG. 2, there are some other advantages compared to other CAN wake-up circuits. Firstly, the wake-up circuit 200 operates using a reduced input supply voltage (e.g., VDD is 2V or less) compared to other CAN wake-up circuits. Also, n-type metal oxide semiconductor (NMOS) transistors are used instead of p-type metal oxide semiconductor (PMOS) transistors, which improves transconductance (gm) performance of the common-gate amplifier circuit 222 compared to amplifiers used in other CAN wake-up circuits. Also, the bias signals for the common-gate amplifier circuit 222 are derived from the common-mode input signal itself, which maintains amplifier's bias even in the presence of very high (e.g., +/−12V) input common mode voltage movements.

In the example of FIGS. 2, R8 and R9 is a referred to supply, which simplifies second stage biasing since the output of the first stage is independent of input common mode variation (e.g., +/−12V). Also, in some examples, the biasing branch used to generate bias signals for the common-gate amplifier 222 is combined with the offset branch used to generator offsets signals for the common-gate amplifier 222 (see e.g., the bias and offset generation circuit 212 of FIG. 2), which reduces power consumption. Also, with the offset generation circuit 212, the biasing changes when the common-mode signal changes. Also, with the wake-up circuit 200, the comparator 232 does not have to support negative values, which reduces complexity compared to other CAN wake-up circuits.

Figure 4:
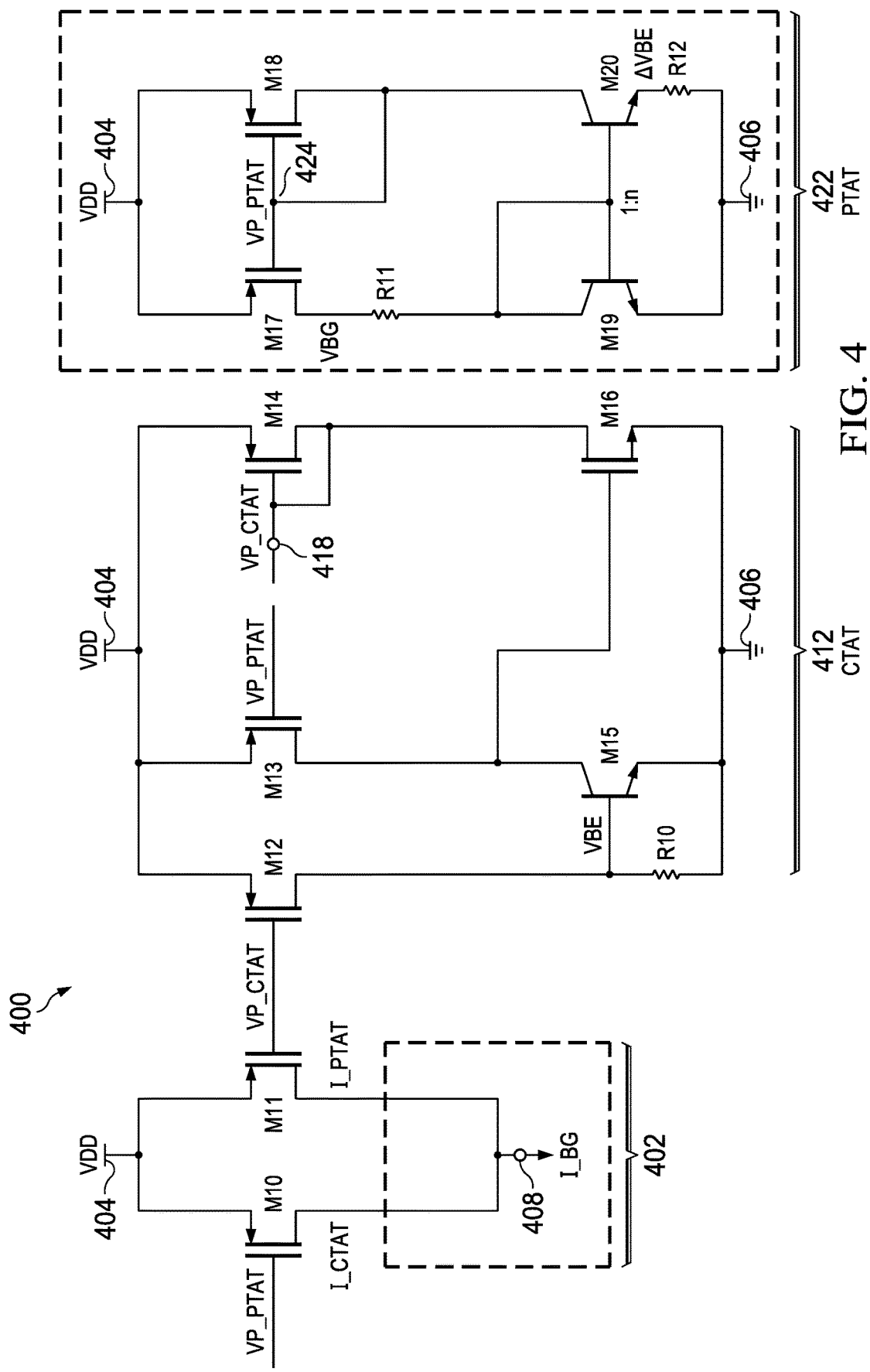
FIG. 4 is a schematic diagram of a bias current circuit related to a wake-up circuit of a CAN transceiver in accordance with some examples.

FIG. 4 is a schematic diagram of a bias current circuit 400 (an example of the bias current source 216 in FIG. 2) related to a wake-up circuit (e.g., the wake-up circuit 202 of FIG. 2) of a CAN transceiver (e.g., the CAN transceiver 102 of FIG. 1) in accordance with some examples. In the example of FIG. 4, the bias current circuit 400 is a bandgap voltage reference circuit. In operation, the bias current circuit 400, provides an offset current for the offset branch of an offset generation circuit (e.g., the offset generation circuit 212 in FIG. 2) and provides a bias current to a comparator (e.g., to the comparator 232 in FIG. 2).

As shown, the bias reference circuit 400 includes a proportional-to-absolute-temperature (PTAT) circuit 422, a complementary-to-absolute-temperature (CTAT) circuit 412, and a combine circuit 402. In the example of FIG. 4, the PTAT circuit 422 includes an input voltage supply (VDD) node 404. The PTAT circuit 422 also includes first and second metal oxide semiconductor (MOS) transistors (M17 and M18) with respective control terminals coupled together and with respective first current terminals coupled to the VDD node 404. The PTAT circuit 422 also includes bipolar transistors (M19 and M20) with respective control terminals coupled together. The PTAT circuit 422 also includes an output node 424 coupled to the control terminals of M17 and M18 and coupled to a first current terminal of M20. As shown, the control terminal of M19 is coupled to a second current terminal of M17 via a resistor (R11) and is coupled to a first current terminal of M19. Also, a second current terminal of M19 is coupled to a ground node 406. Also, a second current terminal of M20 is coupled to the ground node 406 via a resistor (R12). In operation, the PTAT circuit 422 generates a current (AVBE/R12), which is a PTAT current. The PTAT current is then mirrored to M18, which creates an equivalent bias voltage VP_PTAT.

In the example of FIG. 4, the CTAT circuit 414 includes MOS transistors (M12, M13, M14) having respective first current terminals coupled to the VDD node 404. The CTAT circuit 414 also includes a bipolar transistor (M15) having a first current terminal coupled to a second current terminal of M13. The CTAT circuit 414 also includes another MOS transistor (M16) having a control terminal coupled to a second current terminal of M13 and coupled to the first current terminal of M15. The CTAT circuit 414 also includes an output node 418 coupled to the control node of M14 and to the second current terminal of M14. As shown, a control terminal of M13 is coupled to the output node 424 of the PTAT circuit 422. Also, a first current terminal of M16 is coupled to a second current terminal of M14. Also, a second current terminal of M16 is coupled to the ground node 406. Also, a second current terminal of M12 is coupled to a control terminal of M15 and is coupled to the ground node 406 via a resistor (R10). Also, a second current terminal of M15 is coupled the ground node 406. In operation, the CTAT circuit 414 provides a current (VBE/R10), which is of CTAT nature. As the CTAT circuit 414 works at very low supply voltage (e.g., <2V), a feedback scheme involving M16 and M14 is employed.

In the example of FIG. 4, the combine circuit 402 comprises MOS transistors (M10 and M11) having respective first current terminals coupled to the VDD node 404. The second current terminals of M10 and M11 are coupled to a bandgap reference current (I_BG) node 408. As shown, a control terminal of M10 is coupled to the output node 424 of the PTAT circuit 422. Meanwhile, a control terminal of M11 is coupled to the output node 418 of the CTAT circuit 412. The bandgap reference current node 408 is the output of the combine circuit 402 and the bias current circuit 400. In operation, the PTAT and CTAT currents are combined to generate a constant reference current (I_BG) across temperature, which is used as the offset current in an offset generation circuit (e.g., the offset generation circuit 212 in FIG. 2) and as the bias current for a wake-up comparator (e.g., the comparator 232 in FIG. 2). The bias current circuit 400 is configured to operate using a reduced input supply voltage (e.g., VDD is 2V or less) and reduced current levels (e.g., 10 µA or less) compared to other CAN wake-up circuits.

Figure 5:
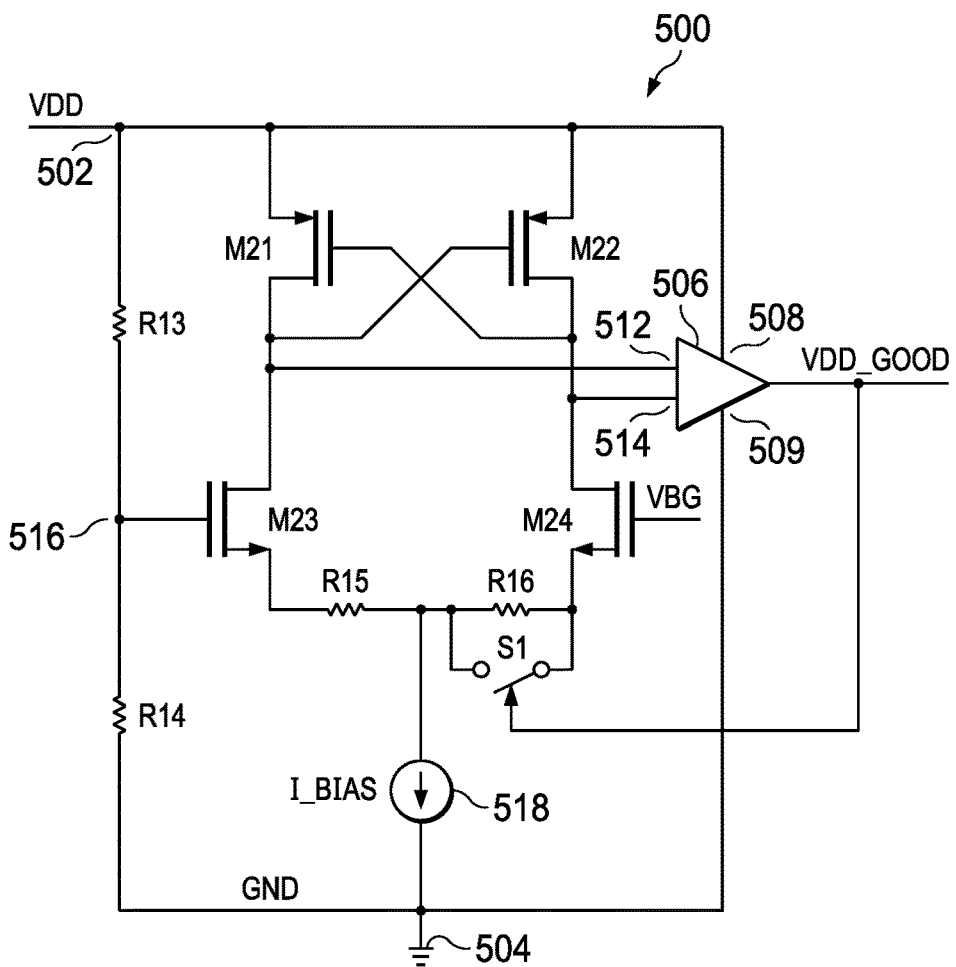
FIG. 5 is a schematic diagram of an under-voltage lockout (UVLO) circuit related to a wake-up circuit of the CAN transceiver in accordance with some examples.

FIG. 5 is a schematic diagram of a UVLO circuit 500 related to a wake-up circuit (e.g., the wake-up circuit 202 of FIG. 2) of a CAN transceiver (e.g., the CAN transceiver 102 of FIG. 1) in accordance with some examples. In the example of FIG. 5, the UVLO circuit 500 includes an input supply voltage (VDD) node 502. The UVLO circuit 500 also includes a comparator 506 with a first input power terminal 508 coupled to the VDD node 502 and with a second input power terminal 509 coupled to a ground node 504. The UVLO circuit 500 also includes transistors (M21 and M22) having respective first current terminals coupled to the VDD node 502. The UVLO circuit 500 also additional transistors (M23 and M24). As shown, a first current terminal of M23 is coupled to a second current terminal of M21, a control terminal of M22, and a first input terminal 512 of the comparator 506. A first current terminal of M24 is coupled to a second current terminal of M22, a control terminal of M21, and a second input terminal 514 of the comparator 506. Also, a control terminal of M24 is coupled to a bias current source (e.g., the bias current source 216 in FIG. 2) or a bias current circuit (e.g., the bias current circuit 400 in FIG. 4) to receive VBG. In some examples, the control terminal of M24 is coupled to a drain terminal of M17 in the PTAT current generation circuit 422.

In the example of FIG. 5, the UVLO circuit 500 also includes a voltage divider formed by resistors (R13 and R14) in series between the VDD node 502 and the ground node 504. As shown, the control terminal of M23 is coupled to an internal node 516 of the voltage divider. Also, the UVLO circuit 500 includes a resistor (R15) coupled between a second current terminal of M23 and a bias current source 518 (e.g., the bias current source 216 in FIG. 2, or the bias current circuit 400 in FIG. 4) configured to provide a bias current (I_BIAS). The UVLO circuit 500 also includes a resistor (R16) coupled between a second current terminal of M24 and the current source 518. As shown, there is a switch (51) across R16, where the control signal for the switch is provided by the output of the comparator 506. In operation, the UVLO circuit 500 is configured to operate using a reduced input supply voltage (e.g., VDD is 2V or less) compared to other CAN wake-up circuits. If VDD drops below a threshold, the comparator 506 outputs a low signal (VDD_GOOD is low) to indicate an under-voltage condition for VDD. Otherwise, the output of the comparator 506 is high (VDD_GOOD is high) to indicate VDD is at an acceptable level. In response to VDD_GOOD being low, a wake-up circuit (e.g., the wake-up circuit 102 of FIG. 1, or the wake-up circuit 202 of FIG. 2) stays in a powered down state.

In this description, the term "couple" or "couples" means either an indirect or direct wired or wireless connection. Thus, if a first device couples to a second device, that connection may be through a direct connection or through an indirect connection via other devices and connections. The recitation "based on" means "based at least in part on." Therefore, if X is based on Y, X may be a function of Y and any number of other factors.

Modifications are possible in the described embodiments, and other embodiments are possible, within the scope of the claims.

What is claimed is:

1. A system, comprising:
   a controller area network (CAN) transceiver, wherein the CAN transceiver comprises a wake-up circuit having:
   an attenuator circuit coupled to a CAN bus;
   a common-gate amplifier circuit coupled to the attenuator circuit; and an offset generation circuit coupled to the common-gate amplifier circuit.

2. The system of claim 1, wherein the offset generation circuit includes a bias current circuit configured to provide a bias current to the common-gate amplifier circuit.

3. The system of claim 2, wherein the offset generation circuit comprises:
a first transistor and a second transistor, wherein a first current terminal of the first transistor is coupled to bias current circuit via a voltage divider, and wherein a second current terminal of the first transistor is coupled to a first current terminal of the second transistor.

4. The system of claim 3, wherein the common-gate amplifier circuit comprises:
a third transistor, a fourth transistor, a fifth transistor, and a sixth transistor,
wherein a control terminal of the third transistor is coupled to the bias current circuit,
wherein a control terminal of the first transistor is coupled to a control terminal of the fifth transistor and to a first internal node of the voltage divider,
wherein a control terminal of the fourth transistor is coupled to a second internal node of the voltage divider,
wherein a control terminal of the second transistor is coupled to a control terminal of the sixth transistor and to a first current terminal of the first transistor.

5. The system of claim 4, wherein a second current terminal of the second transistor is coupled to a second current terminal of the fourth transistor and to a first output node of the attenuator circuit,
wherein a first current terminal of the third transistor is coupled to a first input terminal of a comparator,
wherein a second current terminal of the third transistor is coupled to a first current terminal of the fourth transistor,
wherein a first current terminal of the fifth transistor is coupled to a second input terminal of the comparator,
wherein a second current terminal of the fifth transistor is coupled to a first current terminal of a sixth transistor, and
wherein a second current terminal of the sixth transistor is coupled to a second output node of the attenuator circuit.

6. The system of claim 5, wherein the offset generation circuit further comprises a unidirectional current control circuit between the bias current circuit and the voltage divider, wherein the unidirectional current control circuit comprises a plurality of switches, and wherein the unidirectional current control circuit has a voltage drop below a diode voltage drop.

7. The system of claim 5, wherein the common-gate amplifier circuit further comprises:
a first resistor between the first input terminal of the comparator and a supply voltage node; and
a second resistor between the second input terminal of the comparator and the supply voltage node.

8. The system of claim 1, further comprising:
a microprocessor; and
a plurality of voltage regulators coupled to an input supply voltage node, wherein the plurality of voltage regulators are configured to provide a plurality of supply voltages, and wherein the wake-up circuit is configured to receive an input supply voltage of 2V or less from one of the plurality of voltage regulators.

9. The system of claim 8, wherein the wake-up circuit further comprises:

a bias current circuit coupled to the common-gate amplifier circuit and the offset generation circuit; and
an under-voltage lockout (UVLO) circuit coupled to the bias current circuit,
wherein the bias current circuit and UVLO circuit are configured to receive an input supply voltage of 2V or less from one of the plurality of voltage regulators.

10. The system of claim 9, wherein the bias current circuit is a bandgap reference voltage circuit comprising:
a proportional-to-absolute-temperature (PTAT) circuit;
a complementary-to-absolute-temperature (CTAT) circuit; and
a combine circuit coupled to the PTAT circuit and the CTAT circuit.

11. The system of claim 9, wherein the UVLO circuit comprises:
a comparator configured to detect an under-voltage condition based on a threshold;
a transistor with a control terminal coupled to the bias current circuit, wherein the UVLO circuit is configured to attenuate an input supply voltage and to provide hysteresis for the threshold.

12. A controller area network (CAN) transceiver, comprising:
a wake-up circuit having:
an attenuator circuit coupled to a CAN bus;
an amplifier circuit coupled to the attenuator circuit;
an offset generation circuit with a bias current circuit coupled to the amplifier circuit.

13. The CAN transceiver of claim 12, wherein the amplifier circuit is a common-gate amplifier circuit.

14. The CAN transceiver of claim 12, wherein the bias current circuit is a bandgap voltage reference circuit comprising:
a proportional-to-absolute-temperature (PTAT) circuit;
a complementary-to-absolute-temperature (CTAT) circuit; and
a combine circuit coupled to the PTAT circuit and the CTAT circuit.

15. The CAN transceiver of claim 14, wherein the PTAT circuit comprises:
an input voltage supply node;
first and second metal oxide semiconductor (MOS) transistors with respective control terminals coupled together and with respective first current terminals coupled to the input voltage supply node;
first and second bipolar transistors with respective control terminals coupled together; and
an output node coupled to the control terminals of the first and second MOS transistors and coupled to a first current terminal of the second bipolar transistor,
wherein the control terminal of the first bipolar transistor is coupled to a second current terminal of the first MOS transistor via a first resistor and is coupled to a first current terminal of the first bipolar transistor,
wherein a second current terminal of the first bipolar transistor is coupled to a ground node, and
wherein a second current terminal of the second bipolar transistor is coupled to the ground node via a second resistor.

16. The CAN transceiver of claim 15, wherein the CTAT circuit comprises:
third, fourth, and fifth MOS transistors having respective first current terminals coupled to the input voltage supply node;

a third bipolar transistor having a first current terminal coupled to a second current terminal of the fourth MOS transistor;

a sixth MOS transistor having a control terminal coupled to a second current terminal of the fourth MOS transistor and to the first current terminal of the third bipolar transistor; and an output node coupled to respective control nodes of the third and fifth MOS transistors, wherein a control terminal of the fourth MOS transistor is coupled to the output node of the PTAT circuit, wherein a first current terminal of the sixth MOS transistor is coupled to a second current terminal of the fifth MOS transistor, wherein a second current terminal of the sixth MOS transistor is coupled to the ground node;

wherein a second current terminal of the third MOS transistor is coupled to a control terminal of the third bipolar transistor and is coupled to the ground node via a third resistor, wherein a second current terminal of the third bipolar transistor is coupled the ground node.

17. The CAN transceiver of claim 15, wherein the combine circuit comprises:

seventh and eighth MOS transistors having respective first current terminals coupled to the input voltage supply node, wherein the second current terminals of the seventh and eight MOS transistors are coupled to a bias current node, wherein a control terminal of the seventh MOS transistor is coupled to the output node of the PTAT circuit, and wherein a control terminal of the eighth MOS transistor is coupled to the output node of the CTAT circuit.

18. An integrated circuit, comprising:

a controller area network (CAN) transceiver having a wake-up circuit, wherein the wake-up circuit comprises:

an attenuator circuit coupled to a CAN bus;

an amplifier circuit coupled to the attenuator circuit;

an offset generation circuit coupled to the amplifier circuit;

a bias current circuit included with the offset generation circuit and coupled to the amplifier circuit; and an under-voltage lockout (UVLO) circuit coupled to the bias current circuit.

19. The integrated circuit of claim 18, wherein the amplifier circuit is a common-gate amplifier circuit.

20. The CAN transceiver of claim 18, wherein the UVLO circuit comprises:

an input supply voltage node;

a comparator with a first input power terminal coupled to the input supply voltage node and with a second input power terminal coupled to a ground node;

first and second transistors having respective first current terminals coupled to the input supply voltage node;

third and fourth transistors, wherein a first current terminal of the third transistor is coupled to a second current terminal of the first transistor, a control terminal of the second transistor, and a first input terminal of the comparator, wherein a first current terminal of the fourth transistor is coupled to a second current terminal of the second transistor, a control terminal of the first transistor, and a second input terminal of the comparator, and wherein a control terminal of the fourth transistor is coupled to the bias current circuit.

21. The CAN transceiver of claim 18, wherein the UVLO circuit further comprises:

a voltage divider between the input voltage supply node and the ground node, wherein a control terminal of the third transistor is coupled to an internal node of the voltage divider;

a first resistor coupled between a second current terminal of the third transistor and the bias current circuit; and a second resistor coupled between a second current terminal of the fourth transistor and the bias current circuit.

22. The CAN transceiver of claim 18, wherein the UVLO circuit further comprises a switch between first and second ends of the second resistor, wherein the switch is controlled by an output of the comparator.

* * * * *